United States Patent
Wienand et al.

(10) Patent No.: US 6,787,870 B2
(45) Date of Patent: Sep. 7, 2004

(54) SEMICONDUCTOR COMPONENT WITH INTEGRATED CIRCUIT, COOLING BODY, AND TEMPERATURE SENSOR

(75) Inventors: Karl-Heinz Wienand, Aschaffenburg (DE); Karlheinz Ullrich, Gross-Umstadt (DE)

(73) Assignee: Heraeus Sensor Technology GmbH, Hanau (DE)

( * ) Notice: Subject to any disclaimer, the term of this patent is extended or adjusted under 35 U.S.C. 154(b) by 0 days.

(21) Appl. No.: 10/444,215

(22) Filed: May 23, 2003

(65) Prior Publication Data

US 2003/0227067 A1 Dec. 11, 2003

(30) Foreign Application Priority Data

Jun. 7, 2002 (DE) .......................... 102 25 602

(51) Int. Cl.⁷ ............................. H01L 31/058
(52) U.S. Cl. ................ 257/467; 257/470; 257/706; 257/713; 257/717
(58) Field of Search ................ 257/467, 470, 257/706, 713, 717

(56) References Cited

U.S. PATENT DOCUMENTS

| | | | |
|---|---|---|---|
| 4,791,398 A | * 12/1988 | Sittler et al. | ................ 338/25 |
| 5,596,231 A | 1/1997 | Combs | |
| 5,798,684 A | * 8/1998 | Endo et al. | ............ 338/22 R |
| 6,092,927 A | 7/2000 | Clemente | |
| 6,126,311 A | * 10/2000 | Schuh | ..................... 374/21 |
| 6,504,392 B2 | * 1/2003 | Fredeman et al. | ......... 324/760 |
| 2003/0218862 A1 | * 11/2003 | Dietrich et al. | ............. 361/687 |

FOREIGN PATENT DOCUMENTS

| | | |
|---|---|---|
| DE | 37 33 192 C1 | 10/1988 |
| DE | 37 33 193 C1 | 11/1988 |
| DE | 40 25 715 C1 | 4/1992 |
| DE | 43 00 084 C2 | 7/1995 |
| DE | 195 12 813 C1 | 6/1996 |
| DE | 195 22 126 C2 | 1/1999 |
| DE | 199 18 003 A1 | 1/2000 |
| EP | 0 350 015 B1 | 9/1995 |
| EP | 0 723 293 A1 | 7/1996 |
| EP | 0 578 411 B1 | 4/1998 |
| JP | 08083880 A | 3/1996 |
| WO | WO 80/00878 A1 | 5/1980 |
| WO | WO 96/02942 A1 | 2/1996 |

OTHER PUBLICATIONS

WEGST, Stahlschlüssel ("Steel Key"), 18$^{th}$ edition, ISBN 3–922599–14–1, Verlag Stahlschlüssel West GmbH, Marbach (1998).

* cited by examiner

Primary Examiner—George Eckert
Assistant Examiner—Matthew E. Warren
(74) Attorney, Agent, or Firm—Akin Gump Strauss Hauer & Feld, LLP

(57) ABSTRACT

A semiconductor component with an integrated circuit has a cooling body as a heat sink and a temperature sensor thermally connected thereto, whose resistance is dependent on temperature. The temperature sensor contains a thin film measuring resistor, which is applied to an electrically insulating surface of a foil-like substrate, and the total thickness of the temperature sensor lies in a range of about 10 μm to 100 μm. The thin film measuring resistor is formed as a planar component, with the temperature sensor being arranged between the integrated circuit and the cooling body. The thin film measuring resistor is provided on one side with a thermal coupling layer bordering on the cooling body, while on the other side the resistor has a substrate bordering on a heat distributor, which at least partially surrounds the integrated circuit.

15 Claims, 2 Drawing Sheets

SEMICONDUCTOR COMPONENT WITH INTEGRATED CIRCUIT, COOLING BODY, AND TEMPERATURE SENSOR

BACKGROUND OF THE INVENTION

The invention relates to a semiconductor component having an integrated circuit and, thermally coupled thereto, a temperature sensor, whose resistance is dependent on temperature, and also having a cooling body as a heat sink.

The concept "integrated circuit" includes a semiconductor-based, integrated, electronic circuit (IC) encapsulated in a housing, while the concept "semiconductor component" mentioned at the beginning is directed to a complete component with a cooling body.

From European Patent EP 0 350 015 B1 a semiconductor component with a housing is known, which contains at least a power MOSFET and a sensor thermally connected thereto, wherein the sensor changes its resistance between two of its terminals in dependence on temperature. A thyristor is provided as the temperature sensor, but a bipolar transistor can be used instead. It is possible in this manner to develop a semiconductor component such that the MOSFET is not simply switched off upon reaching a critical temperature, but, for example, its power is reduced by reducing the conductivity.

From International Patent Publication WO 96/02942 a housing for a semiconductor component is known which has a cooling body or a heat sink. Here, an integrated semiconductor component is provided with a conventional lead frame using bonding wires, while it is thermally conductively connected on its underside or in the region of its floor to a plate-shaped heat sink or a cooling body by means of a polymer material. The material of the heat sink preferably consists of aluminum or copper.

Furthermore, from European Patent EP 0 578 411 B1 a semiconductor arrangement is known with a semiconductor device installed on a lead frame and provided in a plastic housing, wherein the surface of the housing over the semiconductor device has upwardly-directed, integrally formed heat dissipating elements, and these heat dissipating elements arc formed as conical projections, which extend within a region provided directly above the semiconductor device.

Still further, from European published patent application EP 0 723 293 A1, a semiconductor arrangement with a heat sink is known, in which a semiconductor element mounted in a lead frame borders directly on a heat sink, which provides for the removal of heat arising in the semiconductor component.

From U.S. Pat. No. 6,092,927 a method of determining the temperature of a power semiconductor is known, wherein an integrated analog switching circuit is co-packaged together with the power semiconductor on a heat sink. In this manner it is possible to determine the thermal resistance between the power semiconductor and the integrated circuit, the thermal resistance between the power semiconductor and the heat sink, and between the analog integrated circuit and the heat sink. Consequently, it is possible to determine the power loss in the power semiconductor, by determining the temperature of the integrated circuit, the temperature of the heat sink by use of thermal capacities, as well as the heat sink temperature and thermal resistance with regard to the voltage and current of the integrated circuit. An output signal is thereby created for an asymptotic display system of the temperature of the power semiconductor.

Moreover, from U.S. Pat. No. 5,596,231 a heat sink is known, which is selectively coated with electrically insulating material, and is provided for an integrated circuit, wherein the electrically insulating material comprises anodically oxidized aluminum, which has been produced by vapor deposition onto the heat sink. The heat sink itself is formed from copper or copper alloys, which are selected for their high thermal conductivity. The entire integrated circuit device can then be accommodated in a plastic housing.

Furthermore, from International Patent Publication WO 80/00878 a differential calorimeter is known, which operates on the heat sink principle. Here, a pair of heat capacity measurement points is symmetrically arranged within a middle section of the heat sink, wherein one of the measuring cells contains a reference substance and the other a so-called sample substance. Temperature measurements are made at different points in time during a temperature measurement period.

BRIEF SUMMARY OF THE INVENTION

The invention has as an object performing an accurate and rapid temperature determination during heat removal from integrated circuits in the region of a heat sink for a semiconductor circuit element; particularly where sensors having small thermal mass are to be used.

The object is achieved in that the temperature sensor has a thin film measuring resistor, which is applied on an electrically insulating surface of a foil-like substrate, wherein the total thickness of the temperature sensor lies in a range of about 10 $\mu$m to 100 $\mu$m, and wherein the temperature sensor is thermally coupled to the cooling body.

It has been found to be particularly advantageous for the thin film measuring resistor, as the temperature sensor, to have only a small thermal mass, because of its small thickness, and to thus make possible an integration into the heat sink region of semiconductor chips without changing the cooling structure. Advantageous embodiments of the invention are set forth below and in the dependent claims.

In a preferred embodiment of the temperature sensor, the thin film measuring resistor is formed as a planar component. The measuring resistor advantageously has a layer in the form of a meandering pattern and substantially comprises platinum or a platinum alloy; the thickness of the layer lies in a range of about 0.8 to 1.2 $\mu$m.

In an advantageous embodiment of the semiconductor component, the temperature sensor is arranged between the integrated circuit and the cooling body.

Furthermore, in an advantageous embodiment of the invention, the thin film measuring resistor is applied to a substrate having an electrically insulating surface, the substrate comprising metal, preferably nickel, a nickel alloy, or an iron alloy with a chromium and aluminum content. The chromium content of this iron alloy is preferably about 20 wt. %, while the aluminum content is about 5 wt. %. This iron alloy, is described in the book C. W. Wegst, *Stahlschlüssel* ("Steel Key"), 18th edition; ISBN 3-922599-14-1,Verlag Stahlschlüssel West GmbH, Marbach (1998), and is also given the material number 1.4767 and the short name (DIN) CrAl 20 5 (X8CrAl20-5).

It has been found to be particularly advantageous that platinum thin film measuring resistors can be applied on nickel foils or foils of a nickel alloy or of an iron alloy having a thickness in a range of about 30 to 80 $\mu$m, giving a substantially delay-free temperature measurement due to the small heat capacity.

In a preferred embodiment of the invention, the thin film measuring resistor is applied to an insulating layer having a thickness in a range of about 2 to 5 μm. The insulating layer advantageously comprises silicon oxide or aluminum oxide and is applied to the substrate by a physical vapor deposition (PVD) process.

Furthermore, in an advantageous embodiment of the invention, a passivation layer is applied to the thin film measuring resistor. This passivation layer preferably is preferably made of silicon oxide (SiO) or aluminum oxide ($Al_2O_3$). The passivation layer has a thickness of about 1 to 5 μm and is applied by a physical vapor deposition (PVD) process.

In a further preferred embodiment, the thin film measuring resistor is arranged in a plane. The measuring resistor or the passivation layer is covered on one side with a thermal coupling layer bordering on the cooling body, while on the other side the resistor has a substrate bordering on a heat distributor, which at least partially surrounds the integrated circuit.

In a still further preferred embodiment of the invention, a layer which is electrically insulating but of good thermal conductivity is arranged between at least a portion of the integrated circuit and the heat distributor.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1A:
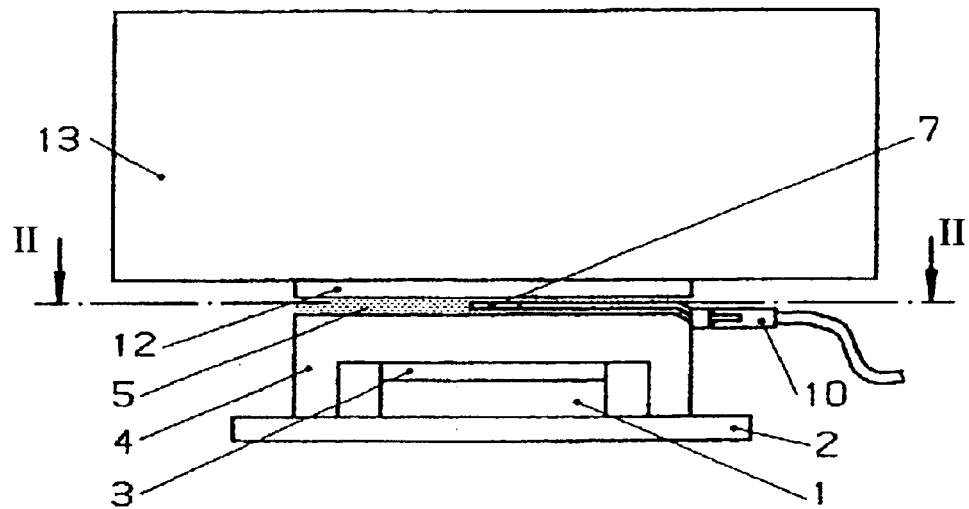
FIG. 1 is schematic longitudinal view, partially in section, of an integrated semiconductor component on a substrate, which is substantially surrounded by a heat distributor, and wherein a temperature sensor can be seen in longitudinal section arranged in a transition region between the heat distributor and the cooling body or heat sink.
FIG. 1b is an enlarged, partially broken away section from FIG. 1a, in which the construction of the sensor, shown schematically in longitudinal section, can be better seen.

According to FIG. 1a, a semiconductor component with integrated circuit 1 is situated on a substrate 2 having an electrically insulating surface, wherein the side of the integrated circuit 1 facing away from the substrate 2 is thermally coupled to a heat distributor 4 by a heat conducting layer 3. The heat distributor 4 here at least partially surrounds the integrated circuit 1 located on the substrate 2, whereas the region connected to the substrate 2 or floor region of the integrated circuit 1 is left free.

On the side of the heat distributor 4 facing away from the substrate 2 is situated an electrically insulating layer 5, but of good thermal conductivity, as a thermal coupling layer, on which is arranged a planar form, platinum-based electrical thin layer resistor as a temperature sensor 7. The temperature sensor 7 has a planar zigzag or meandering resistance layer as the measuring resistor, which is connected by connecting leads 8, 9 (FIGS. 2a, 2b), likewise implemented by thin layer technology, to an outer connector 10.

Figure 1B:
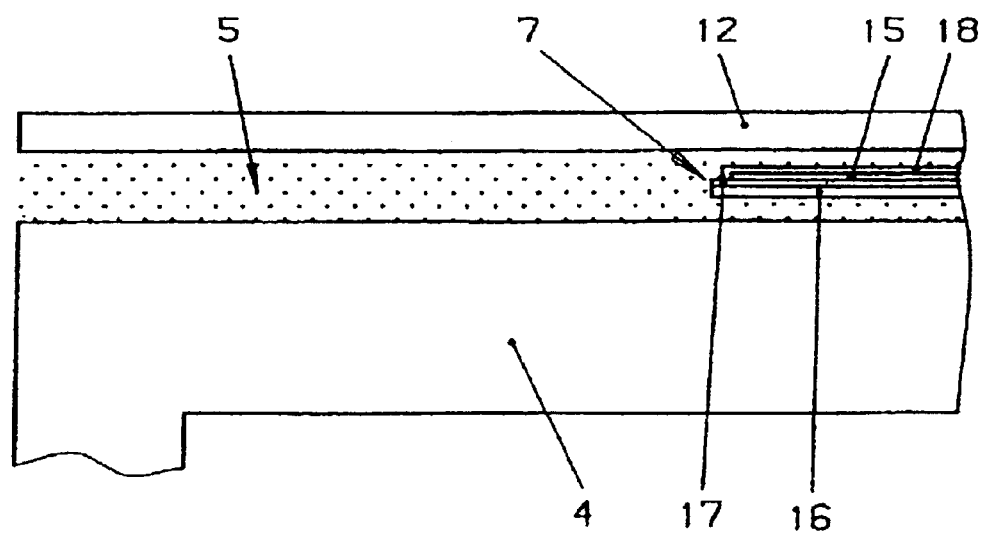

According to FIG. 1b, the measuring resistor 15 of the temperature sensor 7 is applied to a nickel foil, or to a foil 16 of nickel alloy, or to a foil of an iron alloy of material number 1.4767 (Steel Key), wherein an electrically insulating layer or insulating layer 17 having a thickness in a range of about 2 to 5 μm is situated between the foil 16 and the measuring resistor 15, together with the connecting leads (not shown in this Figure). The insulating layer 17 comprises silicon oxide or aluminum oxide.

Furthermore, a second thermal coupling layer 12 can be seen in the longitudinal view according to FIG. 1a or FIG. 1b, which layer 12 on its side facing away from the heat distributor 4 is thermally connected to a heat sink or cooling body 13. The heat sink or cooling body 13 is preferably made of a material with good thermal conductivity, for example copper or aluminum.

The heat-conducting layers 3, 5 and 12 according to FIG. 1a are made of a material which is electrically insulating but of good thermal conductivity, for example ceramic-filled thermally conducting adhesives.

It is thus possible to determine, by way of the temperature sensor 7, the amount of heat flowing from the region of the heat distributor 4 to the heat sink or cooling body 13, and, by way of a temperature signal determined in this manner, for example by changeover measures, to protect the integrated circuit 1 from overheating.

Figure 2A:
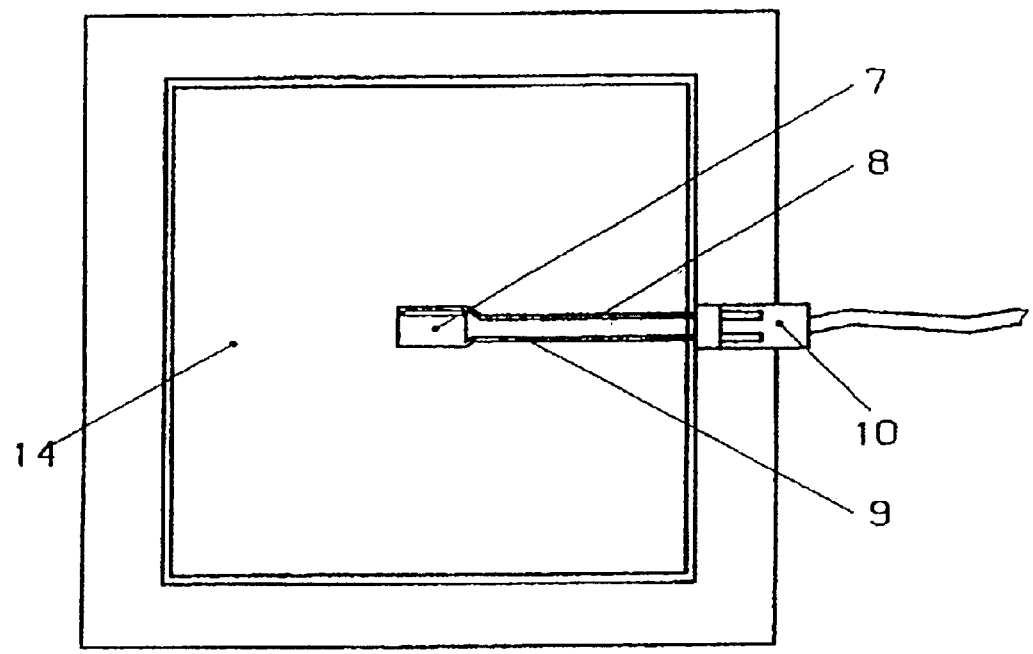
FIG. 2a is a plan view of a temperature sensor (section II—II according to FIG. 1a), arranged directly adjacent to the heat sink.
Figure 2B:
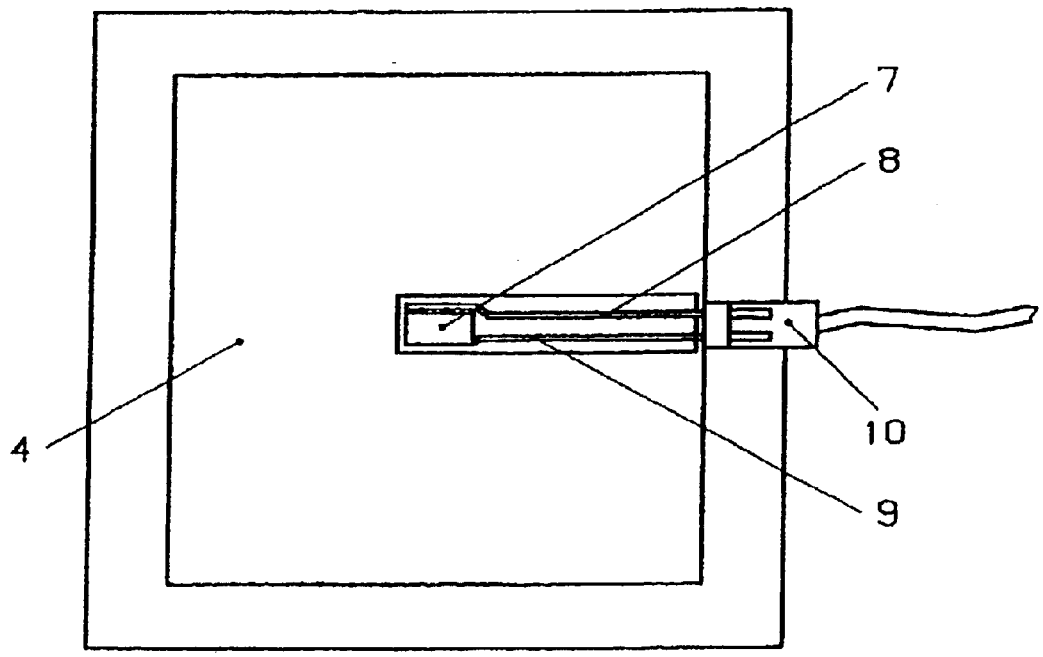
FIG. 2b is an alternative plan view to FIG. 2a (section II—II according to FIG. 1a).

The aluminum nitride layer 14, which can be seen in FIG. 2a, is absent in the arrangement according to FIG. 2b, so that here the temperature sensor 7 is applied directly to the outer surface of the heat distributor 4.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A semiconductor component comprising an integrated circuit (1) thermally connected to a temperature sensor (7) whose resistance is dependent on temperature, and a cooling body (13) provided as a heat sink, wherein the temperature sensor (7) comprises a thin film measuring resistor (15) applied to an electrically insulating surface of a foil-form substrate (16), has a total thickness in a range of about 10 to 100 μm, and is thermally coupled to the cooling body (13).

2. The semiconductor component according to claim 1, wherein the thin film measuring resistor (15) is formed as a planar element.

3. The semiconductor component according to claim 1, wherein the temperature sensor (7) is arranged between the integrated circuit (1) and the cooling body (13).

4. The semiconductor component according to claim 1, wherein the foil-form substrate (16) comprises metal.

5. The semiconductor component according to claim 4, wherein the electrically insulating surface is formed from an insulating layer (17) having a thickness in a range of about 2 to 5 μm.

6. The semiconductor component according to claim 5, wherein the insulating layer (17) comprises silicon oxide or aluminum oxide.

7. The semiconductor component according to claim 6, wherein the insulating layer (17) is applied by physical vapor deposition.

8. The semiconductor component according to claim 1, wherein the foil-form substrate (16) is selected from the group consisting of nickel, a nickel alloy, and an iron alloy containing chromium and aluminum.

9. The semiconductor component according to claim 8, wherein the foil-form substrate (16) has a thickness in a range of about 30 to 80 μm.

10. The semiconductor component according to claim 1, wherein a passivation layer (18) comprising silicon oxide or aluminum oxide is applied to the thin film measuring resistor (15).

11. The semiconductor component according to claim 10, wherein the passivation layer (18) has a thickness in a range of about 1 to 5 μm.

12. The semiconductor component according to claim 10, wherein the passivation layer (18) is applied by physical vapor deposition.

13. The semiconductor component according to claim 1, wherein the thin film measuring resistor (15) is provided on one side with a thermal coupling layer (12) bordering on the cooling body (13), and on an opposite side has a substrate bordering on a heat distributor (4) which is arranged adjacent to the integrated circuit (1).

14. The semiconductor component according to claim 13, wherein the heat distributor (4) at least partially surrounds the integrated circuit (1).

15. The semiconductor component according to claim 13, wherein an electrically insulating layer having good thermal conductivity is arranged between a portion of the integrated circuit (1) and the heat distributor (4).

* * * * *